US008137501B2

(12) United States Patent
Kim et al.

(10) Patent No.: US 8,137,501 B2
(45) Date of Patent: Mar. 20, 2012

(54) BEVEL CLEAN DEVICE

(75) Inventors: Yunsang Kim, Monte Sereno, CA (US); Andrew Bailey, III, Pleasanton, CA (US); Greg Sexton, Fremont, CA (US); Keechan Kim, Dublin, CA (US); Andras Kuthi, Thousand Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 761 days.

(21) Appl. No.: 11/672,922

(22) Filed: Feb. 8, 2007

(65) Prior Publication Data
US 2008/0190448 A1 Aug. 14, 2008

(51) Int. Cl.
C23C 16/00 (2006.01)
C23F 1/00 (2006.01)
H01L 21/306 (2006.01)

(52) U.S. Cl. ............ 156/345.51; 118/715; 118/728; 156/345.45

(58) Field of Classification Search .............. 118/722, 118/723 E, 723 R; 156/345.19, 345.3, 345.43, 156/345.44, 345.45, 345.46, 345.47
See application file for complete search history.

(56) References Cited

U.S. PATENT DOCUMENTS

| 5,006,192 A * | 4/1991 | Deguchi ............... 156/345.44 |
| 5,286,297 A * | 2/1994 | Moslehi et al. ........... 118/723 E |
| 6,124,793 A * | 9/2000 | Knutson ................... 340/584 |
| 6,494,987 B1 * | 12/2002 | Yamaguchi et al. ....... 156/379.6 |
| 6,770,166 B1 * | 8/2004 | Fischer ................... 156/345.47 |
| 7,858,898 B2 | 12/2010 | Bailey, III et al. |
| 2004/0238488 A1 * | 12/2004 | Choi et al. ................... 216/58 |
| 2005/0039682 A1 * | 2/2005 | Dhindsa et al. ........... 118/723 E |
| 2005/0173067 A1 * | 8/2005 | Lim ....................... 156/345.32 |
| 2005/0178505 A1 | 8/2005 | Kim |
| 2006/0086461 A1 | 4/2006 | Inada et al. |

FOREIGN PATENT DOCUMENTS

JP 2001-044147 2/2001
KR 1020070001493 A 1/2007

OTHER PUBLICATIONS

International Search Report dated Jun. 25, 2008 from International Application No. PCT/US2008/053081.
Written Opinion dated Jun. 25, 2008 from International Application No. PCT/US2008/053081.
Office Action dated Aug. 30, 2010 from Chinese Application No. 200880004384.7.
Search Report dated Jan. 4, 2011 from Singapore Patent Application No. 200905165-7.
Examination Report dated Jan. 4, 2011 from Singapore Patent Application No. 200905165-7.

* cited by examiner

*Primary Examiner* — Maureen Gramaglia
*Assistant Examiner* — Tiffany Nuckols
(74) *Attorney, Agent, or Firm* — Beyer Law Group LLP

(57) ABSTRACT

An apparatus for removing material on a bevel of a wafer is provided. A wafer support with a diameter that is less than the diameter of the wafer, wherein the wafer support is on a first side of the wafer, and wherein an outer edge of the wafer extends beyond the wafer support around the wafer is provided. An RF power source is electrically connected to the wafer. A central cover is spaced apart from the wafer support. A first electrically conductive ring is on the first side of and spaced apart from the wafer. A second electrically conductive ring is spaced apart from the wafer. An electrically conductive liner surrounds the outer edge of the wafer. A switch is between the liner and ground, allowing the liner to be switched from being grounded to floating.

16 Claims, 5 Drawing Sheets

BEVEL CLEAN DEVICE

FIELD OF INVENTION

The present invention relates to the formation of semiconductor devices. More particularly, the present invention relates to the selective removal of etch byproducts from a bevel edge during the formation of semiconductor devices.

BACKGROUND OF THE INVENTION

In the processing of a substrate, e.g., a semiconductor substrate or a glass panel such as one used in flat panel display manufacturing, plasma is often employed. During substrate processing, the substrate is divided into a plurality of dies, or rectangular areas. Each of the plurality of dies will become an integrated circuit. The substrate is then processed in a series of steps in which materials are selectively removed (or etched) and deposited. Control of the transistor gate critical dimension (CD) on the order of a few nanometers is a top priority, as each nanometer deviation from the target gate length may translate directly into the operational speed and/or operability of these devices.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge. Typically, there are no dies present near the edge of the substrate, for example between about 5 mm to about 15 mm from the substrate edge. However, as successive byproduct polymer layers are deposited on the top and bottom surfaces of the bevel edge as a result of several different etch processes, organic bonds that are normally strong and adhesive will eventually weaken during subsequent processing steps. The polymer layers formed near the top and bottom surfaces of a substrate edge would then peel or flake off, often onto another substrate during post treatment, such as wet cleaning of the substrate surface, potentially affecting device yield.

Ultrafine feature sizes and high performance requirements have necessitated the integration of low-k dielectrics on semiconductor wafers that are mechanically weaker than previous generation materials. The inherently weaker nature of the low-k dielectric material can pose significant challenges to downstream electronic-packaging processes and materials.

Low-k materials are, by definition, those semiconductor-grade insulating materials that have a dielectric constant ("k") lower than 2.9. In order to further reduce the size of devices on integrated circuits, it has become necessary to use conductive materials having low resistivity and insulators having low-k to reduce the capacitive coupling between adjacent metal lines. Low-k dielectric, carbon, or fluorine-doped films are being integrated into back-end-of-line (BEOL) stacks to improve device performance and allow for device scaling.

However, low-k materials are porous, which introduces a host of process integration and materials compatibility difficulties. The balancing act between maintaining the film's integrity and integrating it properly and performing the necessary stripping, cleaning, and conditioning gets increasingly precarious. Patterning processes (etching, stripping, and cleaning) can also have a drastic impact on the integrity of the porous low-k. Current cleaning plasma gases used are $O_2$ and $CF_4$ or $N_2$ and $CF_4$, which result in the migration of nitrogen, oxygen, or fluorine radicals into the substrate. The migration causes the k value to increase, which changes the composition and degrades the materials.

Thus, low-k damage results in degraded device performance, reduced reliability, lost yield, and other related problems.

SUMMARY OF THE INVENTION

To achieve the foregoing and in accordance with the purpose of the present invention an apparatus for removing material on a bevel of a wafer with a diameter is provided. A wafer support with a diameter that is less than the diameter of the wafer, wherein when a wafer is supported by the wafer support, wherein the wafer support is on a first side of the wafer, and wherein an outer edge of the wafer extends beyond the wafer support around the wafer is provided. An RF power source is electrically connected to the wafer. A central cover is spaced apart from the wafer support so that when the wafer is placed on the wafer support the wafer is placed between the central cover and the wafer support, so that the central cover is on a second side of the wafer. A first electrically conductive ring is on the first side of and spaced apart from the wafer. A second electrically conductive ring is spaced apart from the wafer, wherein an outer edge of the wafer lies between the first electrically conductive ring and the second electrically conductive ring, and wherein the second electrically conductive ring is on the second side of the wafer. An electrically conductive liner surrounds the outer edge of the wafer. A switch is between the liner and ground, allowing the liner to be switched from being grounded to floating.

In another manifestation of the invention a method for cleaning a bevel portion of a wafer is provided. A wafer is placed on a wafer support where the wafer is electrically connected to an RF source and an upper surface of the wafer is spaced apart less than 1 mm from an central cover, wherein the wafer has an outer edge that extends beyond the wafer support, wherein the outer edge of the wafer is between a first conductive ring and a second conductive ring and is surrounded by a conductive liner. A bevel cleaning gas is provided through the central cover. An RF power is provided from the RF source to the wafer. A resistance between the liner and ground is set.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
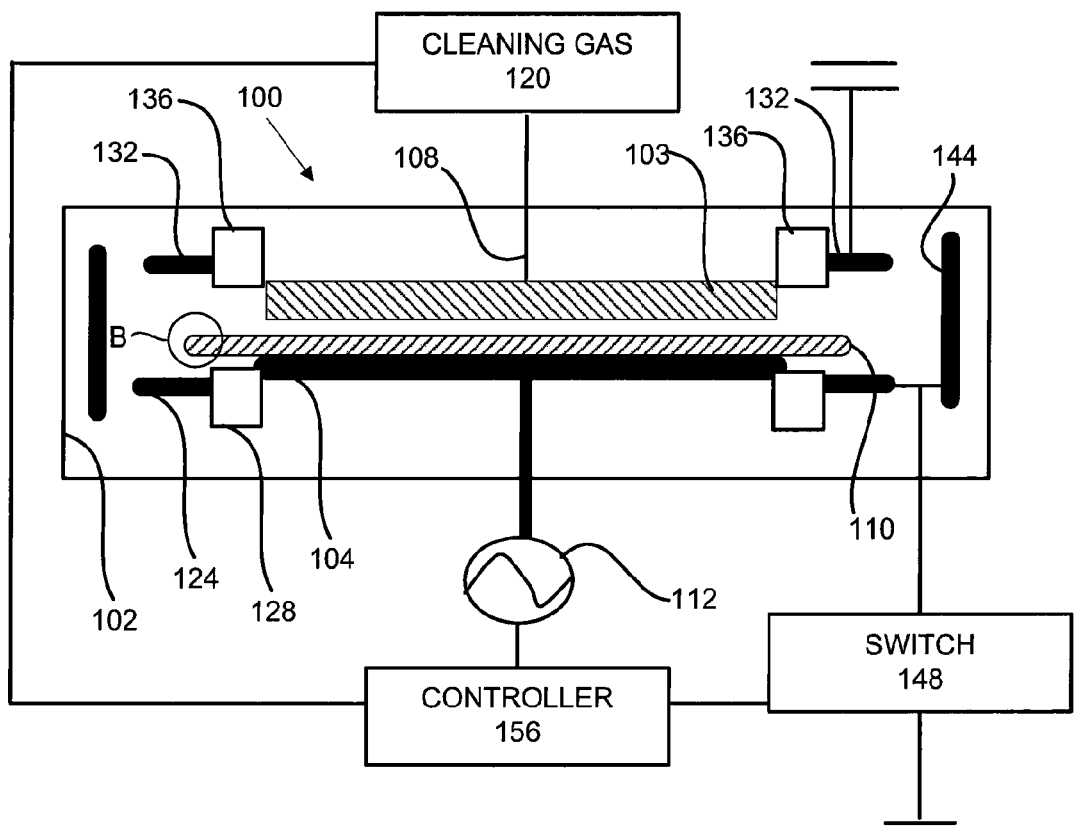
FIGS. 1A and 1B are schematic views of a bevel clean processing chamber that may be used in practicing the invention.

To facilitate understanding, FIG. 1 is a schematic view of a bevel clean process chamber 100 that provides an embodiment of the invention. The bevel of the wafer is the edge of the wafer and part of the top surface of the wafer and bottom surface of the wafer near the edge of the wafer. The bevel clean process chamber 100 is enclosed by chamber walls 102. Chamber 100 has a wafer support 104 on which a wafer 110 is placed. In one embodiment, the wafer support 104 is an electrostatic chuck, which is powered by a RF (radio frequency) power source 112. The wafer support 104 has a diameter that is less than a diameter of the wafer 110 so that the outer edge of the wafer 110 extends beyond the wafer support 104 around the circumference or perimeter of the wafer 110. Spaced apart from the wafer support 104 and a top surface of the wafer 110 is a central cover 103, which acts as a gas distribution plate with a gas inlet 108, which is connected to a gas source 120. Preferably, the central cover 103 is of a dielectric material. In another embodiment of the invention, the central cover is electrically conductive and is grounded. Preferably, the central cover 103 is spaced a distance less than 1 mm from the top surface of the wafer 110 on the wafer support 104. More preferably, the central cover is spaced a distance of less than 0.6 mm from the top surface of the wafer 110. Most preferably, the central cover 103 is spaced between 0.3 mm to 0.4 mm from the top surface of the wafer 110. A first conductive ring 124 surrounds the wafer support 104. The first conductive ring 124 is of a conductive material. An insulator ring 128 is placed between the first conductive ring 124 to space apart and insulate the first conductive ring 124 from the wafer support 104. A second conductive ring 132 surrounds the central cover 103. The second conductive ring 132 is of a conductive material. An insulator ring 136 is placed between the second conductive ring 132 and the central cover 103 to space apart the second conductive ring 132 from the central cover 103. As shown, the outer edge of the wafer is disposed between the first conductive ring 124 and the second conductive ring 132 around the entire perimeter or circumference of the wafer.

An electrically conductive liner 144 surrounds the outer edge of the wafer 110. In this embodiment, the liner 144 is electrically connected to the first conductive ring 124. The electrically conductive liner 144 and the first conductive ring 124 are connected to ground through a switch 148. Preferably, the switch 148 is either an open or closed switch or a variable resistor. If the switch 148 is a variable resistor, preferably the variable resistor provides a resistance between 1 ohm to 100 mega-ohms. More preferably, the variable resistor provides a variable resistance between 10 kilo-ohms and 100 kilo-ohms. The second conductive ring is grounded. A controller 156 is controllably connected to the RF source 112, clean gas source 120, and switch 148.

Figure 5A:
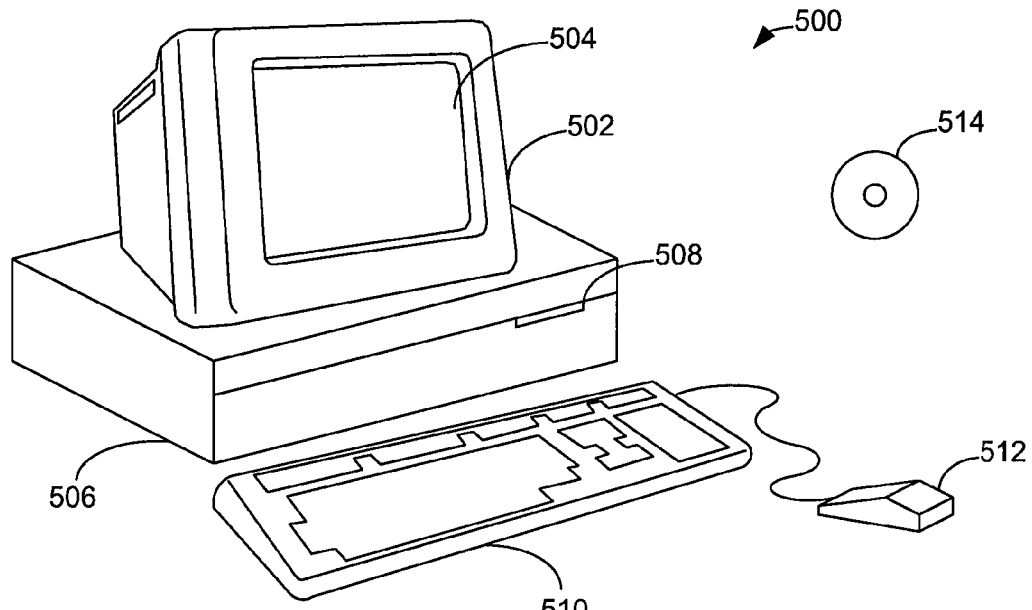
FIGS. 5A-B illustrate a computer system, which is suitable for implementing a controller used in embodiments of the present invention.
Figure 5B:
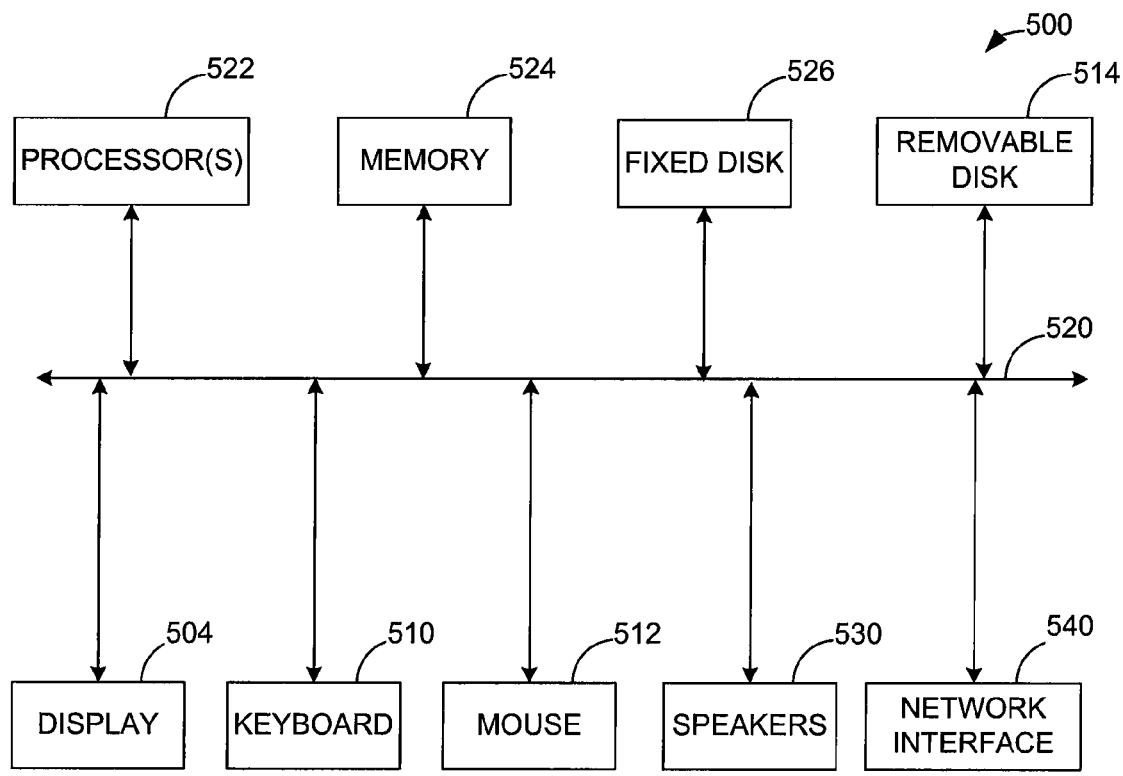

FIGS. 5A and 5B illustrate a computer system 500, which is suitable for implementing a controller 156 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for computer system 500. Attached to system bus 520 is a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2:
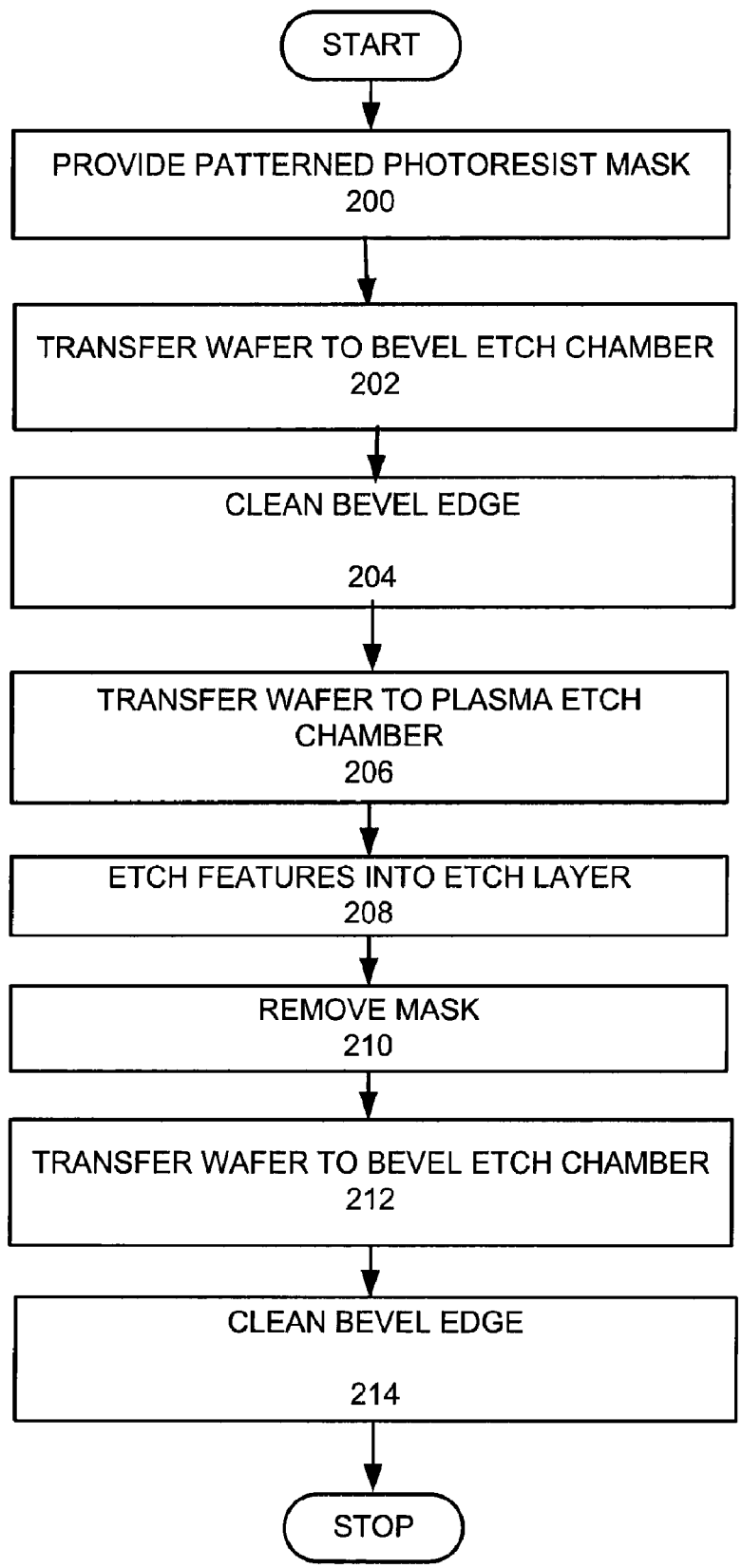
FIG. 2 is a high level flow chart of a process that may be used in an embodiment of the invention.
Figure 3:
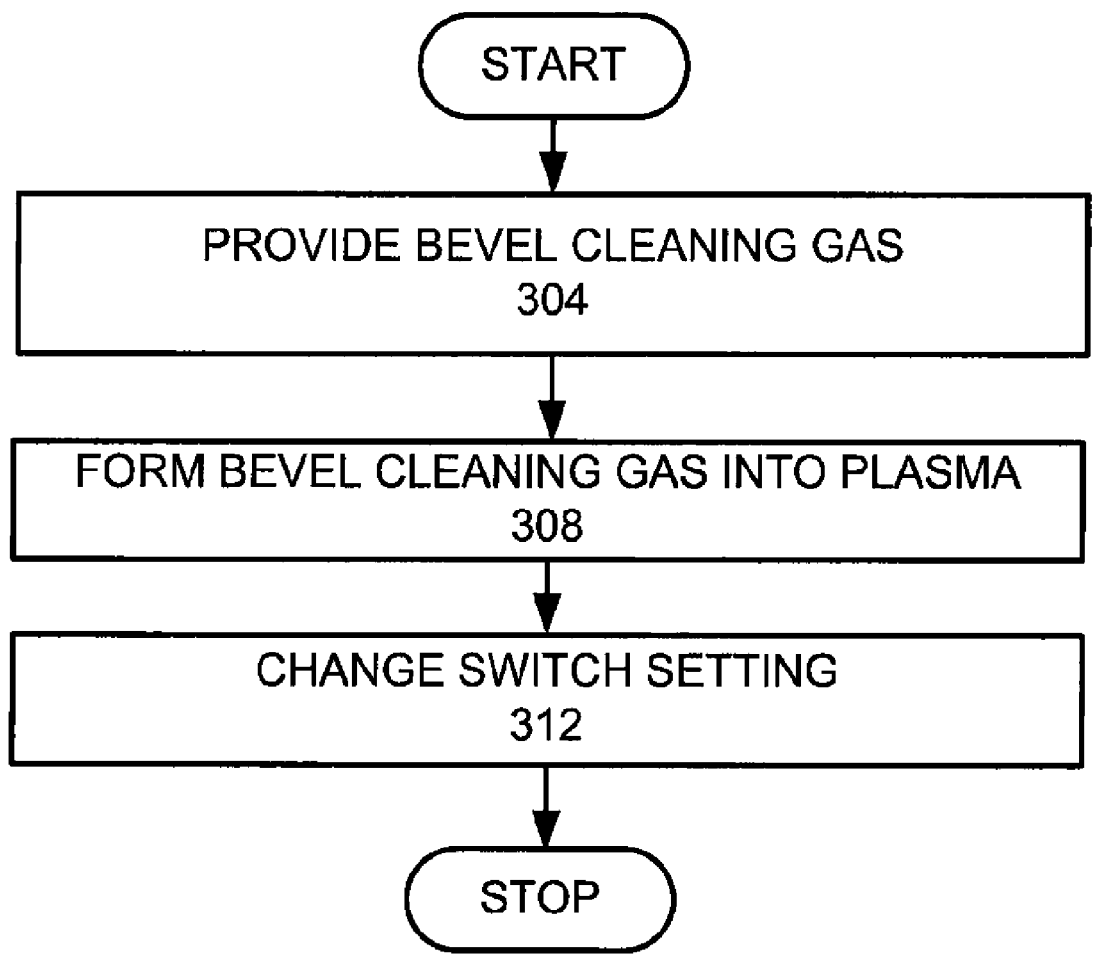
FIG. 3 is a more detailed flow chart of a step of cleaning a bevel edge.

FIG. 2 is a flow chart of a process that uses the above device. A photoresist mask is provided over a wafer (step 200). The wafer is transferred to the bevel clean chamber 100 (step 202). A bevel edge clean is performed in the bevel clean chamber (step 204). FIG. 3 is a more detailed flow chart of the step of cleaning the bevel edge. A bevel cleaning gas is provided (step 304). The bevel cleaning gas is formed into a plasma (step 308). The switch setting is changed (step 312). In other processes, the switch setting is not changed during the cleaning processes, but at other times.

An example of a recipe for a bevel clean is as follows: A chamber pressure is set at 1500 mTorr. A bevel clean gas of 500 sccm of O2 is provided. The RF source provides 600 watts at 13.56 MHz. The switch setting is changed from 1 to 100 M.

Figure 1B:
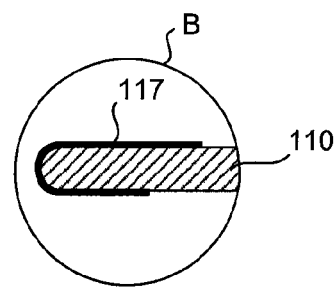

In this example, the bevel clean removes polymer either selectively or nonselectively with respect to another dielectric such as silicon oxide from the bevel edge. FIG. 1B is an enlarged view of section B in FIG. 1A that shows a film of polymer with possibly another dielectric 117 on the edge of a wafer 110 before the film is removed by the cleaning process.

The wafer is transferred from the bevel etch chamber to a plasma etch chamber (step 206). Features are etched into the etch layer in the plasma etch chamber (step 208). The mask is removed using a stripping or ashing process (step 210). The wafer is transferred to the bevel etch chamber (step 212). The wafer is subjected to another bevel clean (step 214). In other embodiments, one or more bevel cleaning processes may be used at different times.

Without being bound by theory, the addition of the liner and the switch unexpectedly allows an improved cleaning process, which allows control of the cleaning rate and cleaning selectivity.

Figure 4A:
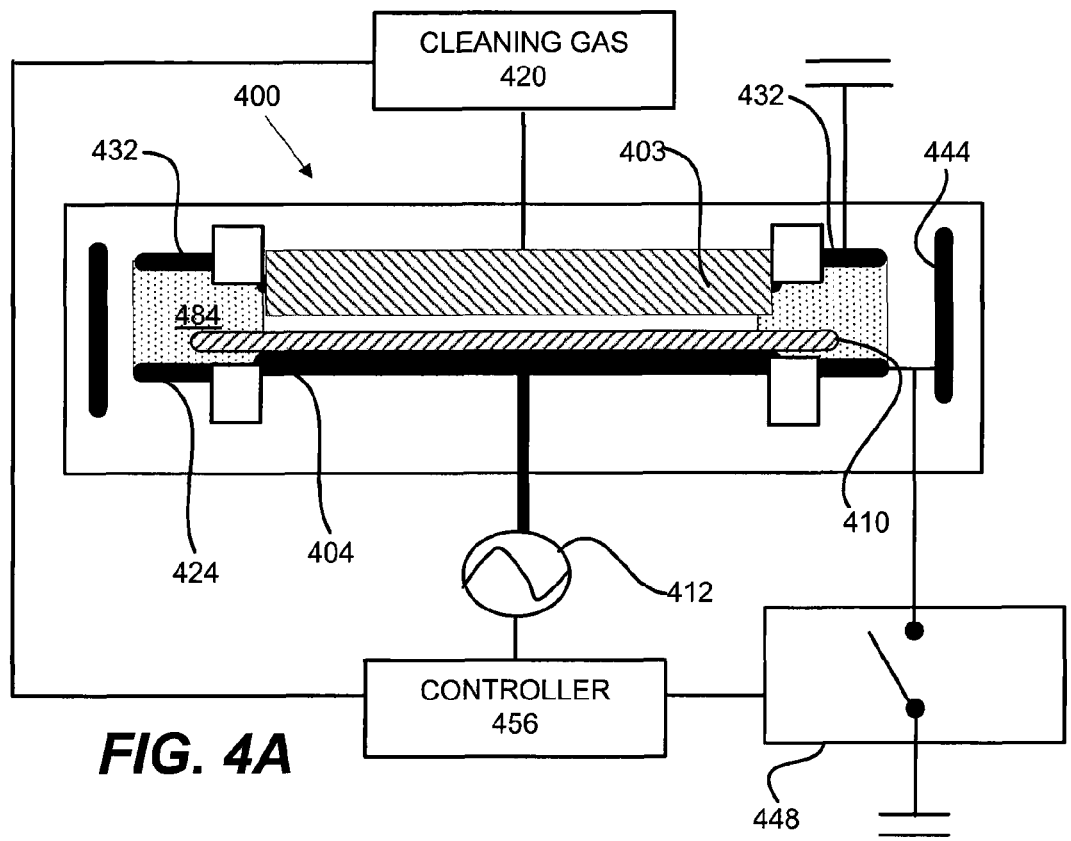
FIGS. 4A and 4B are a schematic view of an embodiment of a plasma processing chamber during different stages.

FIG. 4A is a schematic view of the bevel etch chamber 400 during a bevel clean process where the switch 448 is a switch that has open and closed positions. The controller 456 has the cleaning gas source 420 provide a cleaning gas and the RF source 412 excite the cleaning gas to a plasma. Because the central cover 403 is less than 1 mm from the top surface of the wafer 410 on the wafer support, plasma is not maintained between the central cover 403 and the wafer support 404, but instead between the first conductive ring 424 and the second conductive ring 432. A bevel cleaning gas in this example may comprise at least one of $CO_2$ or $O_2$ and a halogen, such as fluorine. The switch 448 is open causing the first conductive ring 424 and the liner 444 to float, while the second conductive ring 432 is grounded. This causes increased confinement of the plasma 484 in the region between the first conductive ring 424 and the second conductive ring 432. This increased plasma confinement provides a faster bevel cleaning with lower selectivity towards the photoresist. The presence of the halogen helps remove a skin formed by the photoresist and also causes the low selectivity, because the halogen cleans other materials.

Figure 4B:
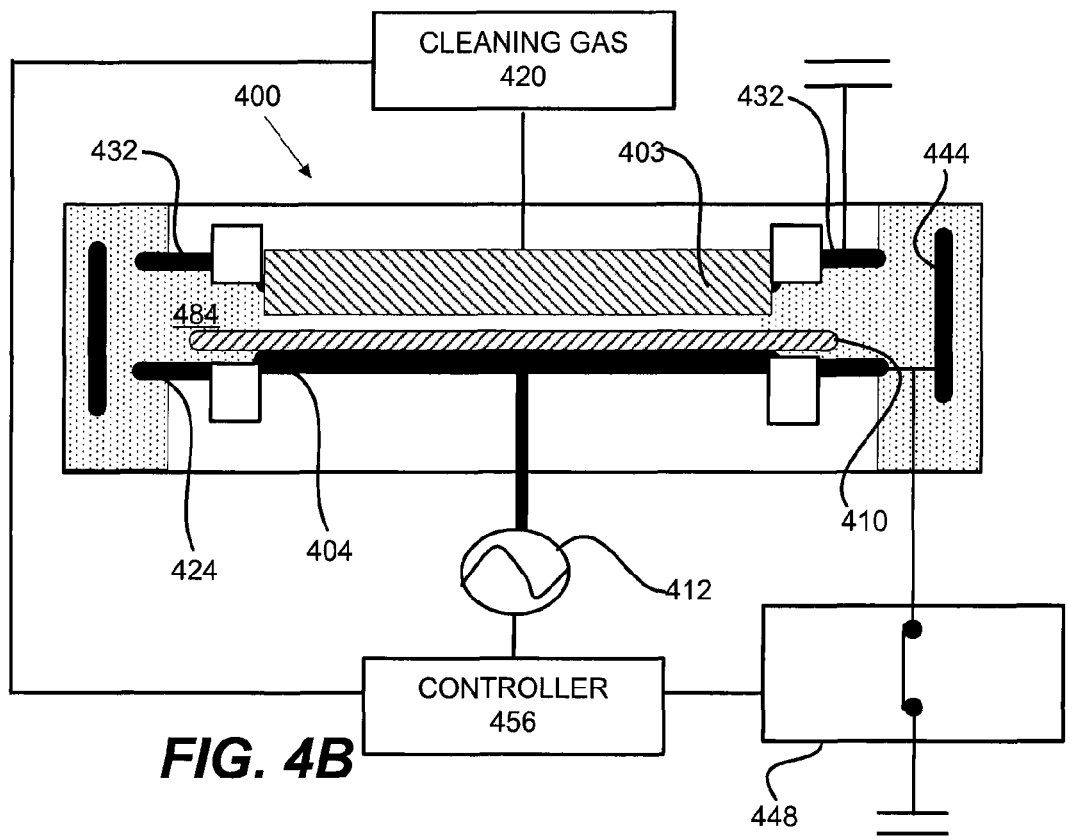

FIG. 4B is a schematic view of the bevel etch chamber 400 where the switch 448 is closed causing the first conductive ring 424 and the liner 444 to be grounded, while the second conductive ring 432 is also grounded. This causes a decrease in the confinement of the plasma 484 and a lower plasma density in the region between the first conductive ring 424 and the second conductive ring 432, because the plasma is spread over a larger volume. This decreased plasma confinement provides a slower bevel cleaning with higher selectivity towards the photoresist. It is believed that the lower density plasma reduces the density of fluorine so that the silicon oxide is etched less. It was unexpectedly found that the photoresist cleaning is not as significantly reduced, thus providing a more selective cleaning.

In other embodiments, the bevel cleaning gas may be at least one of $CO_2$, CO, $C_xH_y$, $H_2$, $NH_3$, $C_xH_yF_z$, or a combination thereof. The pressure may be maintained at 500 mTorr-10 Torr. More preferably, the pressure for cleaning the bevel edge is between 100 mT-10 T. 100 to 2000 Watts of power are supplied to the plasma processing chamber at about 2-27 MHz. In one embodiment of a recipe, 5-3000 sccm of cleaning gas may be used at a temperature of 20° C. for longer than 5 seconds.

In other embodiments, the liner is part of the chamber wall. In another embodiment, the liner is electrically connected to the second conductive ring, but not the first conductive ring and the first conductive ring is grounded. In another embodiment, the liner is electrically connected to both the first and second conductive rings. In another embodiment, the liner is connected to neither conductive ring. In another embodiment, the liner is parallel to the chamber wall.

In another embodiment, the wafer support is of a dielectric material, and the RF power source is electrically connected to the wafer through another means, such as a direct electrical connection between the power source and the wafer. The wafer acts as an electrode.

In some processes, it is desirable to remove both the polymer and another dielectric, such as silicon oxide, silicon nitride, or a low-k dielectric, with a selectivity of 1:1. In other processes, it is desirable to selectively remove the polymer while not removing the silicon oxide, with a selectivity as high as 100:1. Others may want a selectivity in between. Such processes may want to tune the selectivity or the rate of cleaning. The described apparatus allows for such selection. The use of a variable resistor for the switch 148 allows for a more continuous selection than a switch, which has only an open and closed position. Using a variable duty cycle of open and closed may provide more variation for an open or closed switch.

In another embodiment, the central cover is of a conductive material and is movable to increase the spacing between the surface of the wafer and the central cover. In such an embodiment the space is increased so that plasma may be maintained between the central cover and the wafer, so that the bevel etch chamber may be used as an etch chamber for etching features.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for removing material on a bevel of a wafer with a diameter, comprising:
   a wafer support with a diameter that is less than the diameter of the wafer, wherein when a wafer is supported by the wafer support, wherein the wafer support is on a first side of the wafer, and an outer edge of the wafer extends beyond the wafer support around the wafer;

an RF power source electrically connected to the wafer;

a central cover spaced apart from the wafer support so that when the wafer is placed on the wafer support the wafer is placed between the central cover and the wafer support, so that the central cover is on a second side of the wafer;

a first electrically conductive ring on the first side of and spaced apart from the wafer;

a second electrically conductive ring spaced apart from the wafer, wherein an outer edge of the wafer lies between the first electrically conductive ring and the second electrically conductive ring and wherein the second electrically conductive ring is on the second side of the wafer;

an electrically conductive liner surrounding the outer edge of the wafer and spaced apart from the first electrically conductive ring and the second electrically conductive ring; and a switch between the liner and ground, allowing the liner to be switched from being grounded to floating.

2. The apparatus of claim 1, wherein the central cover is spaced less than 1 mm from a top surface of the wafer.

3. The apparatus of claim 2, wherein the central cover is of a dielectric material to form an insulator.

4. The apparatus, as recited in claim 3, wherein the outer edge of the wafer lies between the first electrically conductive ring and the second electrically conductive ring around an entire perimeter of the wafer.

5. The apparatus of claim 4, wherein the electrically conductive liner is electrically connected to at least one of the first or second electrically conductive rings.

6. The apparatus of claim 5, wherein the first electrically conductive ring surrounds and is spaced apart from wafer support and wherein the second electrically conductive ring surrounds and is spaced apart from the central cover.

7. The apparatus of claim 6, wherein one of the first or second electrically conductive rings is not electrically connected to the electrically conductive liner and is grounded.

8. The apparatus of claim 7, wherein the switch comprises a variable resistor that provides a variable resistance from at least 1 ohm to no more than 100 Mega-ohms.

9. The apparatus of claim 8, wherein the wafer support is a conductive electrode and provides an electrical connection between the RF source and the wafer.

10. The apparatus of claim 7, wherein the switch has an open state that cause the liner to float and a closed state that grounds the liner.

11. The apparatus of claim 7, wherein the first electrically conductive ring is electrically insulated from the wafer support.

12. The apparatus of claim 7, further comprising:

a chamber surrounding the wafer support, first electrically conductive ring, second electrically conductive ring, the central cover and electrically conductive liner; and a bevel cleaning gas source in fluid connection with the chamber.

13. The apparatus of claim 1, wherein the electrically conductive liner is electrically connected to at least one of the first or second electrically conductive rings.

14. The apparatus of claim 1, wherein the first electrically conductive ring surrounds and is spaced apart from wafer support and wherein the second electrically conductive ring surrounds and is spaced apart from the central cover.

15. The apparatus of claim 1, wherein only one of the first or second electrically conductive rings is electrically connected to the electrically conductive liner and is grounded.

16. The apparatus, as recited in claim 1, wherein the switch allows the liner to be floating without being connected to a power source.

* * * * *